(12) United States Patent
Harazono

(10) Patent No.: US 6,707,125 B2
(45) Date of Patent: Mar. 16, 2004

(54) SOLID-STATE IMAGING APPARATUS AND MANUFACTURING METHOD THEREOF

(75) Inventor: Fumikazu Harazono, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/301,256

(22) Filed: Nov. 21, 2002

(65) Prior Publication Data

US 2003/0094665 A1 May 22, 2003

(30) Foreign Application Priority Data

Nov. 22, 2001 (JP) ........................................ 2001-357987

(51) Int. Cl.⁷ .................. H01L 31/0203; H01L 31/0232
(52) U.S. Cl. ...................................... 257/434; 257/432
(58) Field of Search ................................. 257/431–434

(56) References Cited

U.S. PATENT DOCUMENTS

| | | | | |
|---|---|---|---|---|
| 5,821,532 A | * | 10/1998 | Beaman et al. | 257/433 |
| 6,396,116 B1 | * | 5/2002 | Kelly et al. | 257/432 |
| 6,518,656 B1 | * | 2/2003 | Nakayama et al. | 257/434 |

* cited by examiner

*Primary Examiner*—Gene M. Munson
(74) *Attorney, Agent, or Firm*—Pearne & Gordon LLP

(57) ABSTRACT

A solid-state imaging apparatus of the present invention includes a structure formed of an insulating resin and having a through-aperture, a wiring pattern formed on the surface of the structure, a solid-state image pickup element connected to the wiring pattern and fitted to the structure to cover the through-aperture, and a light transmitting member fitted to the structure to be opposite to the solid-state image pickup element and to cover the through-aperture, and which further comprises, in the light transmitting member fitting area where the light transmitting member is fitted to the structure, a through-groove that communicates with the through-aperture.

4 Claims, 6 Drawing Sheets

SOLID-STATE IMAGING APPARATUS AND MANUFACTURING METHOD THEREOF

BACKGROUND OF THE INVENTION

The present invention relates to a solid-state imaging apparatus and a manufacturing method thereof, in particular to a small-sized solid-state imaging apparatus with a semiconductor image pickup element therein, for example, for monitoring cameras, cameras for medical treatment and on-vehicle cameras, and to a manufacturing method thereof.

This type of imaging apparatus is popular these days. An image is inputted in the imaging apparatus via an optical system such as a lens or the like, and the imaging apparatus outputs the image as an electric signal. With the recent tendency toward small-sized and high-quality imaging apparatus, cameras are also small-sized and are much used in various fields, and the market share of the imaging apparatus of the type for image-inputting device is increasing.

In a conventional imaging apparatus with a solid-state image pickup element, the components of lenses, solid-state image pickup elements and LSIs with driving circuits and signal processing circuits mounted thereon is formed in the respective housings or package structures followed by combined them. The combined assembly is generally completed by mounting the constitutive components on a flat circuit-printing board.

For further size reduction, a three-dimensional printed circuit resin board 101 is proposed as shown in FIG. 5 and FIG. 6 as well as Japanese Patent Publication No. 2001-245186. As illustrated, the printed circuit board 101 includes rectangular parallelepiped legs 101A and a body 101B standing thereon, and has an aperture 101C in the boundary between the legs 101A and the body 101B. A printed wiring pattern 122 is formed on the back of each leg 101A of the printed circuit board 101. A lens 102 is fitted into the inner space of the body 101B. Around the center of the optical axis 117 of the lens 102, an optical filter 103 is disposed above the aperture 101C, and a semiconductor image pickup element 104, a type of a solid-state image pickup element, and chip parts 108 are disposed below the aperture 101C. With a solder paste 114, the semiconductor image pickup element 104 and the chip parts 108 are connected to the terminal pattern 122 formed around each leg 101A. Thus constructed, the printed circuit board 101 is connected, via the solder paste 114, to the main substrate 113 of various appliances such as mobile phones, personal computers and the like. FIG. 7 is an explanatory view showing the main part of the printed circuit board 101. As illustrated, the semiconductor image pickup element 104 is connected to a terminal pattern 105 formed on the surface of each leg 101A, via a bump 106 formed on its surface, and this is sealed up with a sealant resin 107 so as to be integrated with the three-dimensional printed circuit board 101. In these figures, the same reference numerals designate the same parts.

FIGS. 8A to 8C show a method of assembling the parts into an imaging apparatus. As illustrated, a three-dimensional printed circuit board 101 is formed (FIG. 8A); then a solid-state image pickup element 104 is fitted to the printed circuit board 101 (FIG. 8B); and thereafter an optical filter 103 is fitted to the printed circuit board 101 (FIG. 8C).

In the method, therefore, the three-dimensional, the printed circuit board is greatly deformed in the heating step of fitting the solid-state image pickup element into the printed circuit board, and, as a result, the bonding area in which the solid-state image pickup element is bonded to the printed circuit board receives extremely large stress, and is often cracked to cause bonding failure.

The three-dimensional printed circuit board of the type as described above may be obtained through injection molding, which, however, is problematic in that only a predetermined small amount of ordinary extender pigment (filler) that serves for reducing the expansion coefficient of molding resin material could be added to the resin material to be molded, from the viewpoint of the molding accuracy and of the durability of the mold to be used for such injection molding.

Another problem with the injection-molding method is that ordinary thermoplastic resin suitable for injection molding has a linear molecule-bonding structure and is therefore anisotropic, or that is, its linear expansion coefficient is small in the molecule-bonding direction but is large in the direction perpendicular to the molecule-bonding direction.

As so mentioned in the above, in the heating step of fitting a solid-state image pickup element to a three-dimensional, printed circuit board is problematic in that the heated board is greatly deformed to thereby give extremely large stress to the bonding area in which the solid-state image pickup element is bonded to the board and, as a result, the bonding area is often cracked to cause bonding failure. In general, the bonding area is constituted by a pad attached to the solid-state image pickup element and a terminal electrode of the three-dimensional printed circuit board. In the bonding area, the image pickup element and the board are bonded to each other with an electroconductive adhesive such as silver paste or in a mode of ultrasonic bonding or thermal pressure bonding.

In any of these bonding methods, however, the three-dimensional printed circuit board is thermally deformed and the solid-state image pickup element is often peeled off from the deformed board. This is one reason for the low productivity in the known process.

As so mentioned hereinabove, the three-dimensionally structured, the printed circuit board enables small-sized solid-state imaging apparatus, but on the other hand, its thermal deformation is larger than that of ordinary flat boards. One serious problem with the three-dimensional printed circuit board is that its thermal deformation caused by the difference in the expansion coefficient between the constituent parts is great and is therefore an inevitable bar to the productivity increase in the known process.

The optical filter 103 is generally formed of a glass material of, for example, a crystal reflector or an IR (infrared)-cutting coated glass plate, and its thermal expansion coefficient is smaller than that of a resin material, and therefore its thermal deformation is also smaller than that of the resin material.

Given that situation, by first fitting the optical filter 103 to the printed circuit board 101 before the solid-state image pickup element is fitted thereto, this may solve the problem of thermal deformation of the board in the step of fitting the image pickup element to the board. In fact, however, the solid-state image pickup element must be directly bonded to the board via its bump, and thereafter the bonding area and therearound must be sealed up with a sealant resin. Accordingly, this method involves some other problems. For example, the gas generated in the sealing step will be trapped in the through-aperture 101C and will react with the surface of the solid-state image pickup element under heat, or the gas will increase the inner pressure of the constructed device and will deteriorate the solid-state image pickup element, or it will deform the three-dimensional printed wiring board.

For these reasons, in manufacturing the imaging apparatus of the conventional structure, the optical filter must be fitted to the printed circuit board after the solid-state image pickup element has been fitted thereto.

SUMMARY OF THE INVENTION

The present invention has been made in consideration of the current situation as above, and is to prevent thermal deformation of the components such as the three-dimensional printed circuit board of solid-state imaging apparatus thereby to enable sure bonding of a solid-state image pickup element to the board and to improve the bonding quality of the solid-state image pickup element in the constructed imaging apparatus.

Given that situation, the solid-state imaging apparatus of the invention is so designed that the light transmitting member fitting area where the member is fitted to a structure of the device is formed to have a through-groove that communicates with the through-aperture formed in the structure in order that the gas inside the aperture can be discharged out of it through the through-groove. In manufacturing the imaging apparatus, an optical filter is first fitted to the structure thereof, and thereafter a solid-state image pickup element is fitted thereto. With that, the invention has made it possible to prevent thermal deformation of the structure of the device owing to the presence of the optical filter fitted to the structure.

Specifically, the solid-state imaging apparatus of the invention includes a structure formed of an insulating resin and having a through-aperture, a wiring pattern formed on the surface of the structure, a solid-state image pickup element connected to the wiring pattern and fitted to the structure to cover the through-aperture, and a light transmitting member fitted to the structure to be opposite to the solid-state image pickup element and to cover the through-aperture, and further comprises, in the light transmitting member fitting area where the light transmitting member is fitted to the structure, a through-groove that communicates with the through-aperture.

Thus constructed, the light transmitting member fitting area of the structure in the imaging apparatus has a through-groove that communicates with the through-aperture formed in the structure. Accordingly, even when a solid-state image pickup element is fitted to the structure after a light transmitting member such as an optical filter has been fitted thereto, the inner gas generated in the step of fitting the solid-state image pickup element to the structure is discharged out through the through-groove, and therefore the invention is free from the problem that the gas generated in the sealing step is trapped in the through-aperture 1C and reacts with the surface of the solid-state image pickup element under heat, or the generated gas increases the inner pressure of the device being constructed to deteriorate the solid-state image pickup element or to deform the structure of the device. In addition, in the invention, since a light transmitting member that undergoes little thermal deformation is first fitted to the structure of the device being constructed and thereafter a solid-state image pickup element is fitted thereto, the structure is substantially prevented from being thermally deformed and is substantially free from bonding failure in the step of fitting the member and the element thereto.

Preferably, the structure of the device comprises legs with the wiring pattern formed thereon and a cylindrical body standing on the legs, and the through-aperture is between the body and the legs.

Thus constructed, the overall structure of the imaging apparatus could be a more scaled-down microstructure, which, however, may cause a problem of bonding failure owing to the thermal deformation of the bonding area thereof. In the invention, however, since a through-groove is formed in the structure, a solid-state image pickup element may be fitted to the structure after a light transmitting member such as an optical filter, of which the thermal expansion coefficient is smaller than that of the insulating resin to constitute the structure and which undergoes little thermal deformation, has been fitted thereto. Accordingly, in the invention, the structure formed of an insulating resin is prevented from being thermally deformed, and a solid-state image pickup element is surely fitted thereto to increase the bonding reliability.

Also preferably, the light transmitting member of the device of the invention is an optical filter.

The distance between an optical filter and a solid-state image pickup element is a matter of importance. Of the device of the invention thus constructed, the structure is prevented from being deformed in the light transmitting member fitting area thereof and therearound, and is thereby prevented from being thermally deformed in the area in which a solid-state image pickup element is fitted thereto and therearound. Accordingly, in the device of the invention, the distance reliability between the solid-state image pickup element and the optical filter is increased, which therefore enables the device to receive more excellent images.

Also preferably, the optical filter is formed of a material of which the thermal expansion coefficient is smaller than that of the insulating resin to form the structure.

In this embodiment, since the optical filter is formed of a material of which the thermal expansion coefficient is smaller than that of the insulating resin to form the structure, the structure is more effectively prevented from being thermally deformed and the bonding reliability between the solid-state image pickup element and the wiring pattern formed on the structure is further increased.

The method of the invention for manufacturing such a solid-state imaging apparatus comprises a structure-shaping step of shaping an insulating resin into a structure that comprises a through-aperture, a solid-state image pickup element bonding area at which a solid-state image pickup element maybe fitted to the through-aperture, and a light transmitting member fitting area to which a light transmitting member is fitted to cover the through-aperture while being spaced from the solid-state image pickup element bonding area by a predetermined distance therebetween, and further comprises, in the light transmitting member fitting area, a through-groove that communicates with the through-aperture; a wiring step of forming a wiring pattern on the structure; a light transmitting member fitting step of fitting a light transmitting member to the light transmitting member fitting area; and a solid-state image pickup element bonding step of fitting a solid-state image pickup element to the solid-state image pickup element bonding area of the structure with the light transmitting member being fitted thereto.

In the method of the invention constituted as above, the light transmitting member fitting area of the structure is so designed as to have a through-groove that communicates with the through-aperture of the structure, and after a light transmitting member such as an optical filter has been fitted to the area, a solid-state image pickup element is fitted to the solid-state image pickup element bonding area of the structure. Accordingly, in the method, the inner gas having been generated in the solid-state image pickup element bonding step is discharged out through the through-groove, not trapped in the through-aperture IC in the sealing step. Therefore, the method is free from the problem that the generated gas reacts with the surface of the solid-state image pickup element under heat and increases the inner pressure thereby to deteriorate the solid-state image pickup element and to deform the structure, and enables increased bonding reliability. In addition, in the method, after the light transmitting member which undergoes little thermal deformation has been fitted to structure, the solid-state image pickup element is fitted thereto. Therefore, in the method, the structure is prevented from being thermally deformed while the two, the light transmitting member and the image pickup element are fitted thereto, and it is free from the problem of bonding failure.

Preferably, in the method, the structure-shaping step is an injection-molding step of injection-molding a thermoplastic insulating resin into the structure.

In case where the structure is formed through injection-molding of a thermoplastic resin, it may be often deformed while it is cured, and may also be deformed while the constructed device is used at high temperatures, therefore often causing some problem in that the solid-state image pickup element may fail to firmly bond to the structure (three-dimensional, printed wiring board) of the device. However, in the method of the invention that comprises the steps as above, a light transmitting member such as an optical filter is first fitted to the structure and thereafter a solid-state image pickup element is then fitted thereto. In the method, therefore, the light transmitting member of a glass sheet or the like, of which the thermal expansion coefficient is smaller than that of the insulating resin to form the structure and which therefore undergoes little thermal deformation, prevents the insulating resin structure from being thermally deformed and increases the bonding reliability of the solid-state image pickup element to the structure.

Also preferably in the method of the invention, the through-groove is formed in the direction perpendicular to the direction in which the thermoplastic resin is injection-molded to give the structure, at the opposite ends of the through-aperture adjacent thereto.

In this embodiment, the thermoplastic resin to be injection-molded into the structure has a linear molecule-bonding structure and is therefore anisotropic, or that is, its thermal expansion coefficient is small in the molecule-bonding direction but is large in the direction perpendicular to the molecule-bonding direction. In addition, the filler in the molding material is oriented in the resin flow direction, and, as a result, the anisotropy of the molded resin structure is large in the direction perpendicular to the resin flow direction. Therefore in the embodiment of the invention, the through-groove is formed in the direction perpendicular to the resin flow direction and at the opposite ends of the through-aperture adjacent thereto, whereby the thus-constructed structure is prevented from being elongated in the direction perpendicular to the resin molecule-bonding direction.

BRIEF DESCRIPTION OF THE INVENTION

DETAILED DESCRIPTION OF THE PREFERRED EMBODIMENT

Preferred Embodiments of the invention are described hereinafter with reference to the drawings attached hereto.

Figure 1:
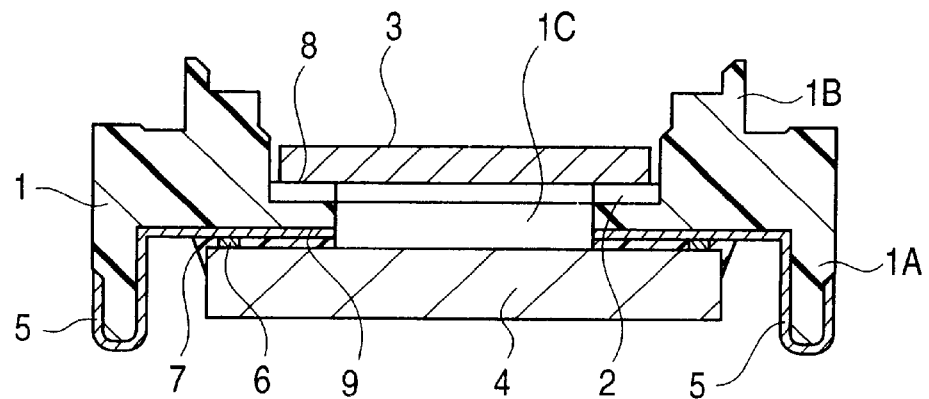
FIG. 1 is a cross-sectional view showing one embodiment of the solid-state imaging apparatus of the invention.

FIG. 1 is an explanatory view showing an essential feature of one embodiment of the solid-state imaging apparatus of the invention.

As illustrated, the solid-state imaging apparatus includes a structure 1 to which a solid-state image pickup element is fitted, and the structure 1 is so designed that its area to which an optical filter 3 is to be fitted has a through-groove 2 that communicates with a through-aperture 1C of the structure, and the gas having been generated inside the device being manufactured can be discharged out through the through-groove 2. After the optical filter 3 has been fitted to the structure 1, a solid-state image pickup element 4 is fitted thereto. The optical filter 3 is formed of a crystal reflector.

Specifically, the solid-state imaging apparatus that includes the structure 1, the solid-state image pickup element 4 and the optical filter 4 is designed as follows: The structure 1 is formed of an insulating polyphthalamide resin, and includes rectangular parallelepiped legs 1A and a body 1B standing thereon. It has a through-aperture 1C in the boundary between the legs 1A and the body 1B, and has, in the fitting area 8 thereof in which the optical filter 3 is fitted thereto, a through-groove 2 that communicates with the through-aperture 1C. Via the through-groove 2, the gas having been generated in the device being constructed can be discharged out of the device. On a part of the surface of the structure 1, formed is a wiring pattern that includes a terminal pattern 5. The solid-state image pickup element 4 is fitted to the through-aperture 1C and is electrically connected with the terminal pattern 5. The optical filter 3 is fitted to the optical filter fitting area 8 of the structure 1 to cover the through-aperture 1C, while being spaced from the solid-state image pickup element 4 by a predetermined distance therebetween.

Figures 2A, 2B, 2C:
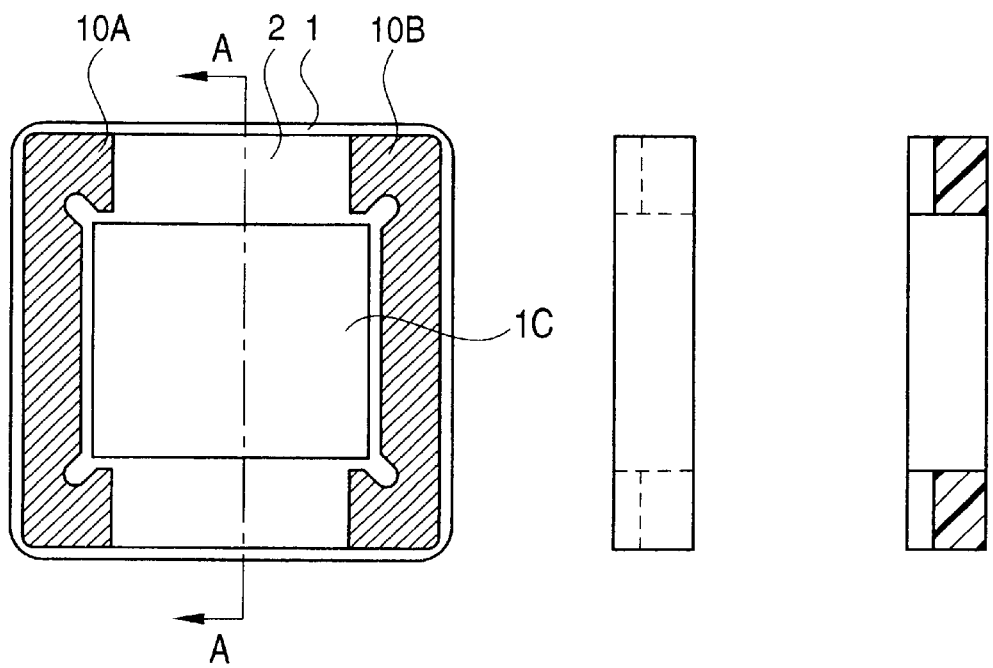
FIGS. 2A to 2C show an optical filter fitting area in one embodiment of the invention.

In this embodiment, the through-groove 2 is formed in the direction perpendicular to the direction in which the thermoplastic resin is injection-molded to give the structure 1, at the opposite ends of the through-aperture 1C adjacent thereto, as in FIGS. 2A to 2C that show the plan view of the optical filter fitting area of the structure 1, the side view thereof and the A—A cut cross-sectional view thereof, respectively.

As so mentioned hereinabove, the thermoplastic resin to be injection-molded into the structure 1 has a linear molecular-bonding structure and is therefore anisotropic, or that is, its thermal expansion coefficient is small in the molecule-bonding direction but is large in the direction perpendicular to the molecule-bonding direction. Accordingly, the through-groove is formed in the direction perpendicular to the direction in which the thermoplastic resin is injection-molded to give the structure 1, at the opposite ends of the through-aperture adjacent thereto, whereby the thus-constructed structure 1 is prevented from being elongated in the direction perpendicular to the resin molecule-bonding direction.

Next described is the method for manufacturing the solid-state imaging apparatus.

Figure 4A:
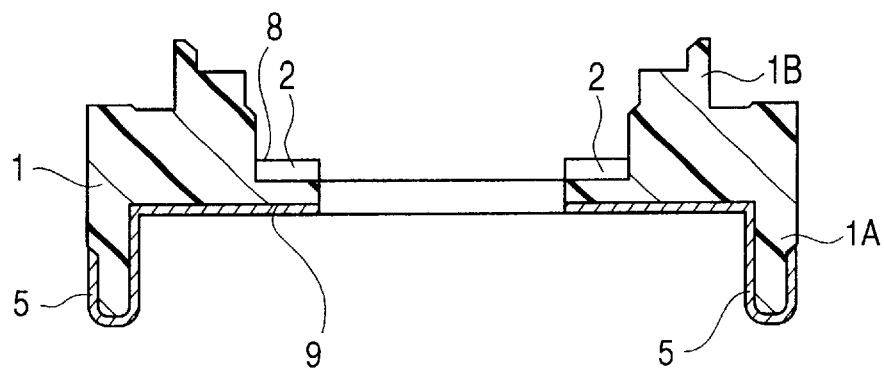
FIGS. 4A to 4C show one embodiment of a method for manufacturing the solid-state imaging apparatus of the invention.

As in FIG. 4A, a polyphthalamide resin is injection-molded into a structure 1, which is composed of rectangular parallelepiped legs 1A and a body 1B standing thereon. The structure 1 has a through-aperture 1C in the boundary between the legs 1A and the body 1B, and has a through-groove 2 that communicates with the through-aperture 1C. With that, a wiring pattern that includes a terminal pattern 5 is formed on a predetermined region of the structure 1, or that is, on a part of the back of each leg 1A according to a thin film-forming process of, for example, plating or sputtering.

Figure 4B:
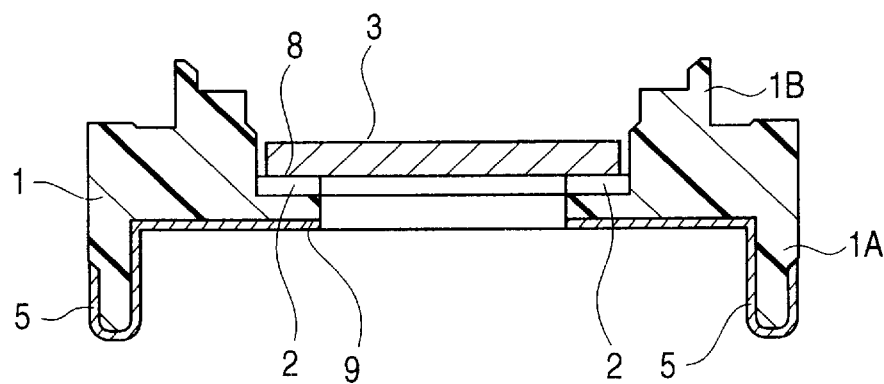

Next, as in FIG. 4B, an optical filter 3 is fitted to the optical filter fitting area of the structure 1 in such a manner that it covers one side of the through-aperture 1C, not closing the through-groove 2.

Figure 4C:
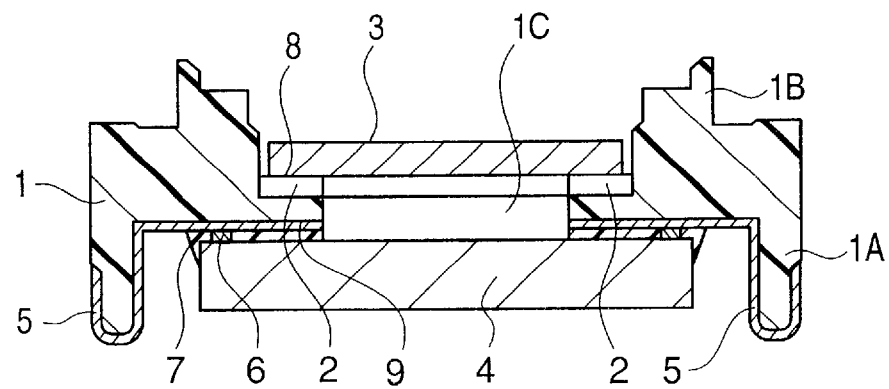
Figure 5:
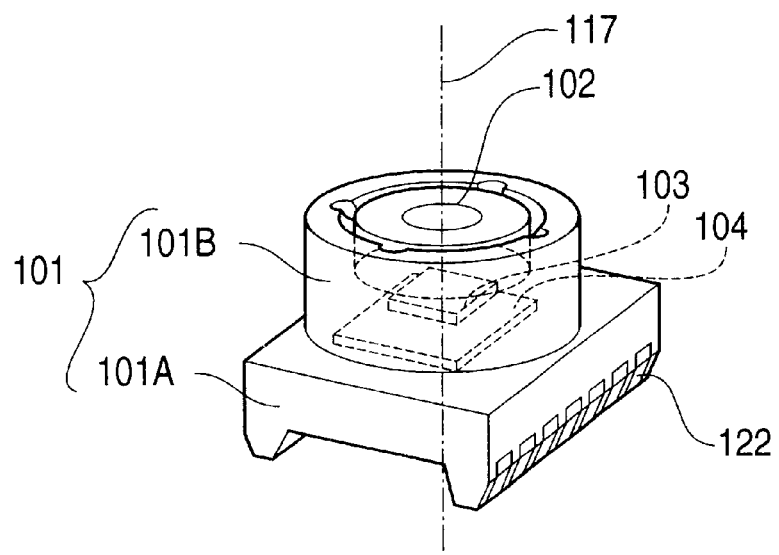
FIG. 5 is a perspective view showing a conventional solid-state imaging apparatus.
Figure 6:
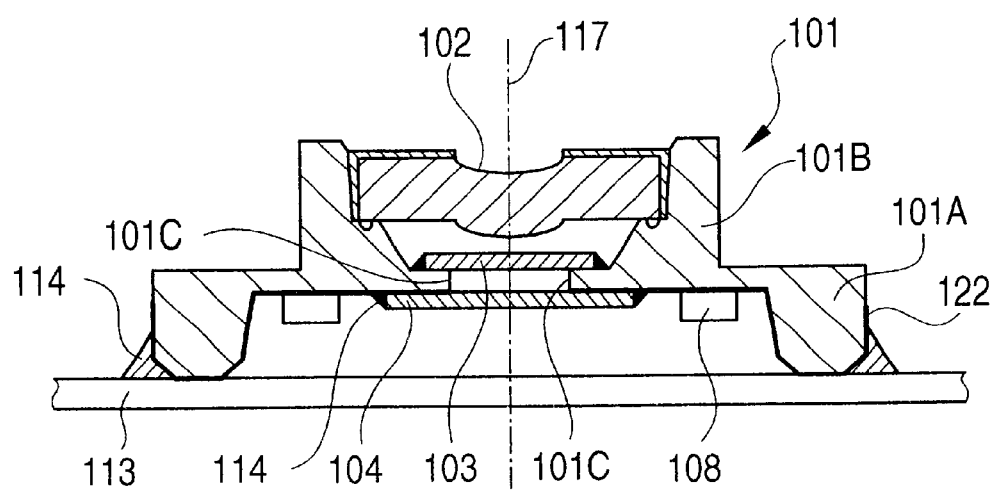
FIG. 6 is a cross-sectional view showing the conventional solid-state imaging apparatus.
Figure 7:
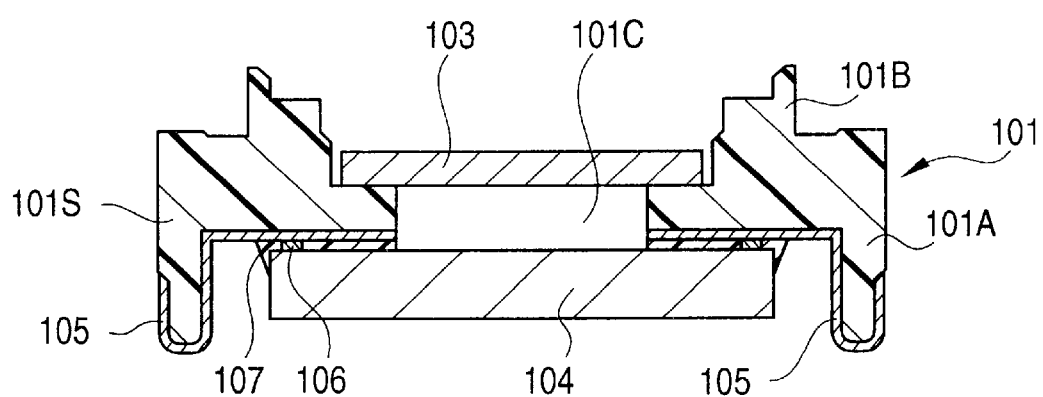
FIG. 7 is an explanatory view showing a main part of the conventional solid-state imaging apparatus.
Figure 8A:
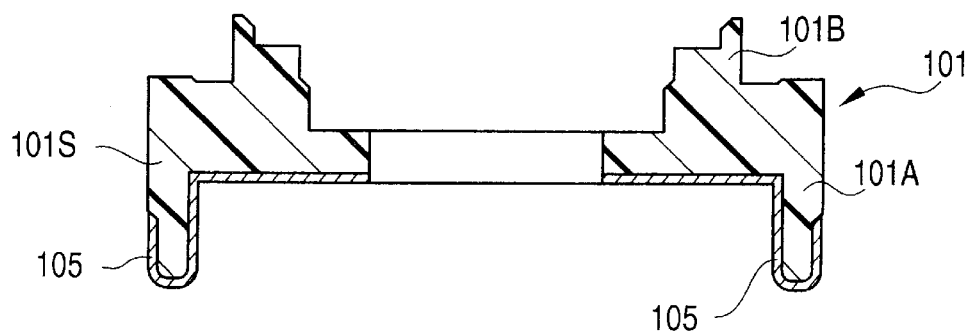
FIG. 8 is an explanatory view showing a main part of the process of manufacturing the conventional solid-state imaging apparatus.
Figure 8B:
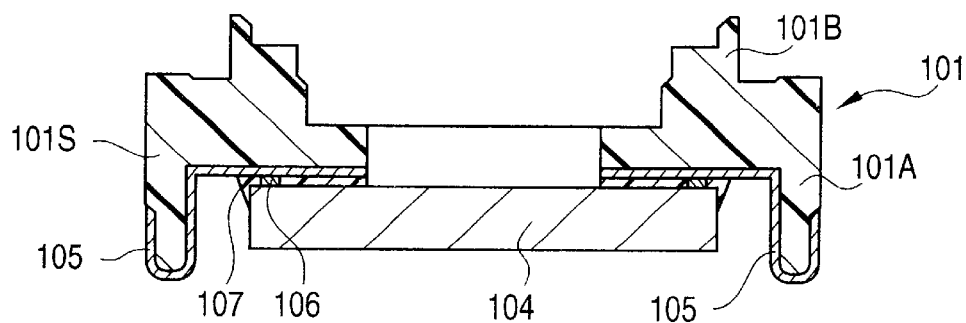
Figure 8C:
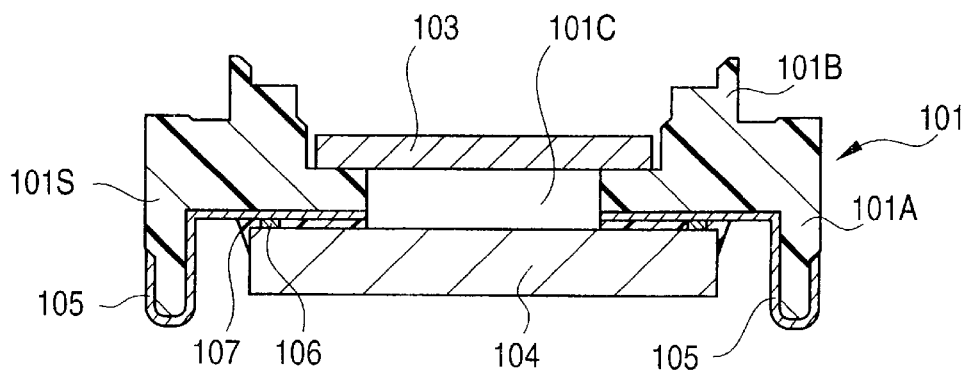

Next, as in FIG. 4C, a solid-state image pickup element (chip) 4 is fitted to the other side of the through-aperture 1C of the structure 1. A bump 6 is formed on the connecting electrode of the solid-state image pickup element 4, and the connecting electrode is connected under thermal pressure to one end of the terminal pattern formed on the legs 1A of the structure 1 via the bump 6. With that, the thus-constructed device is sealed up with resin. For this, concretely, the surface of the solid-state image pickup element is covered with a resin sealant 7.

The optical filter 3 is a dielectric interference filter formed by depositing a multi-layered, thin dielectric film having a desired refractive index, on the surface of a crystal plate in a mode of vapor deposition.

In the method of manufacturing a solid-state imaging apparatus, an optical filter which undergoes little thermal deformation and of which the thermal expansion coefficient is smaller than that of the structure of the device is first fitted to the structure and then a solid-state image pickup element is fitted thereto. Accordingly, in the method, the optical filter serves as a fixing member and prevents the structure from being thermally deformed, and the bonding reliability of the solid-state image pickup element to the structure is therefore increased.

In the method illustrated, the structure is formed through injection molding of a polyphthalamide resin, and the resin has a linear molecule-bonding structure and is therefore anisotropic, or that is, its thermal expansion coefficient is small in the molecule-bonding direction but is large in the direction perpendicular to the molecule-bonding direction. Therefore in this embodiment, the through-groove is formed in the direction perpendicular to the direction in which the thermoplastic resin is injection-molded to give the structure, at the opposite ends of the through-aperture adjacent thereto, whereby the thus-constructed structure is prevented from being elongated in the direction perpendicular to the resin molecule-bonding direction.

Figure 3A:
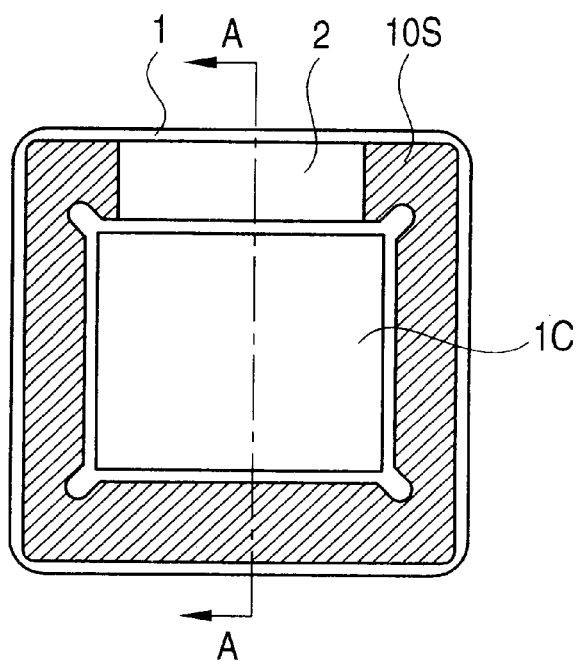
FIGS. 3A to 3C show a modification of the optical filter fitting area in one embodiment of the invention.
Figure 3B:
Figure 3C:

In the embodiment of FIG. 2, two through-grooves are formed at the opposite ends of the through-aperture adjacent thereto. Apart from this embodiment, however, one through-groove may be formed only on one end of the through-aperture as in FIG. 3.

In the embodiments mentioned above, an optical filter is used for the light transmitting member, which, however, is not limitative. Apart from it, a light transmitting sealant member, a lens or the like may be suitably used for the member.

For the resin to form the structure, not only thermoplastic resin such as polyphthalamide resin or PPS resin but also thermosetting resin such as epoxy resin is also employable.

The solid-state imaging apparatus of the invention is not limited to cameras in the field of optical communication, but may also be applicable to any other various optical appliances such as reading devices of CD, DVD, etc., reading devices for copiers, as well as medical instruments, door phones, etc.

As described hereinabove, the solid-state imaging apparatus of the invention is so designed that the light transmitting member fitting area of the structure thereof is formed to have a through-groove that communicates with the through-aperture formed in the structure. Therefore, in manufacturing the device, even when a light transmitting member such as an optical filter is first fitted to the structure and thereafter a solid-state image pickup element is fitted thereto, the inner gas having been generated in the solid-state image pickup element bonding step is discharged out through the through-groove, not trapped in the through-aperture in the sealing step. Therefore, the device of the invention is free from the problem that the generated gas increases the inner pressure thereby to deteriorate the solid-state image pickup element and to deform the structure. In the device of the invention, the bonding failure is evaded and the bonding reliability is increased.

In addition, the method of manufacturing the solid-state imaging apparatus of the invention is free from the problem that the gas having been generated in the sealing step is trapped in the through-aperture 1C and reacts with the surface of the solid-state image element of the device under heat to increase the inner pressure, and thereby deteriorates the solid-state image pickup element and deforms the structure, and therefore the method enables increased bonding reliability. In addition, in the method, the structure is prevented from being thermally deformed while the constitutive components are fitted thereto, and it is free from the problem of bonding failure.

What is claimed is:

1. A solid-state imaging apparatus comprising:
   a structure formed of an insulating resin and having a through-aperture;
   a wiring pattern formed on the surface of the structure;
   a solid-state image pickup element connected to the wiring pattern and fitted to the structure to cover the through-aperture; and
   a light transmitting member fitted to the structure to be opposite to the solid-state image pickup element and to cover the through-aperture;
   wherein the structure includes a through-groove that communicates with the through-aperture provided in the light transmitting member fitting area of the structure where the light transmitting member is fitted to the structure.

2. The solid-state imaging apparatus as claimed in claim 1, wherein the structure comprises legs with the wiring pattern formed thereon and a cylindrical body standing on the legs, and wherein the through-aperture is between the body and the legs.

3. The solid-state imaging apparatus as claimed in claim 1, wherein the light transmitting member is an optical filter.

4. The solid-state imaging apparatus as claimed in claim 3, wherein the optical filter is formed of a material of which the thermal expansion coefficient is smaller than that of the insulating resin.

* * * * *